(12) United States Patent
Sasaki et al.

(10) Patent No.: US 8,492,809 B2
(45) Date of Patent: Jul. 23, 2013

(54) SPIN INJECTION ELECTRODE STRUCTURE, SPIN TRANSPORT ELEMENT, AND SPIN TRANSPORT DEVICE

(75) Inventors: Tomoyuki Sasaki, Tokyo (JP); Tohru Oikawa, Tokyo (JP); Kiyoshi Noguchi, Tokyo (JP); Toshio Suzuki, Akita (JP)

(73) Assignees: TDK Corporation, Tokyo (JP); Akita Prefecture, Akita (JP)

( * ) Notice: Subject to any disclaimer, the term of this patent is extended or adjusted under 35 U.S.C. 154(b) by 202 days.

(21) Appl. No.: 13/216,965

(22) Filed: Aug. 24, 2011

(65) Prior Publication Data

US 2012/0056254 A1    Mar. 8, 2012

(30) Foreign Application Priority Data

Sep. 3, 2010 (JP) ................ P2010-198159

(51) Int. Cl.
*H01L 29/82* (2006.01)
(52) U.S. Cl.
USPC ............. 257/295; 257/421; 257/E29.323
(58) Field of Classification Search
CPC ........................................ H01L 29/82
USPC ............................. 428/846.1, 846.3
See application file for complete search history.

(56) References Cited

U.S. PATENT DOCUMENTS

| 7,534,626 | B2 * | 5/2009 | Parkin | 438/3 |
| 8,269,293 | B2 * | 9/2012 | Hong et al. | 257/421 |
| 8,335,059 | B2 * | 12/2012 | Ishikawa et al. | 360/324.2 |
| 8,357,962 | B2 * | 1/2013 | Marukame et al. | 257/295 |
| 2010/0314702 | A1 * | 12/2010 | Sasaki et al. | 257/421 |

OTHER PUBLICATIONS

Sasaki at al., "Electrical Spin Injection into Silicon Using MgO Tunnel Barrier," *Applied Physics Express*, The Japan Society of Applied Physics, 2009, vol. 2, pp. 053003-1-053003-3.
Erve et al., "Electrical injection and detection of spin-polarized carriers in silicon in a lateral transport geometry," *Applied Physics Letters*, 2007, vol. 91, pp. 212109-1-212109-3.
Ando et al., "Electrical injection and detection of spin-polarized electrons in silicon through an $Fe_3Si/Si$ Schottky tunnel barrier," *Applied Physics Letters*, 2009, vol. 94, pp. 182105-1-182105-3.
Dash et al., "Electrical creation of spin polarization in silicon at room temperature," *Nature*, 2009, vol. 462, No. 26, pp. 491-494.

* cited by examiner

*Primary Examiner* — Stephen W Smoot
(74) *Attorney, Agent, or Firm* — Oliff & Berridge, PLC

(57) ABSTRACT

The present invention provides a spin injection electrode structure, a spin transport element, and a spin transport device which enable effective spin injection in a silicon channel layer at room temperature. A spin injection electrode structure IE comprises a silicon channel layer 12, a first magnesium oxide film 13A disposed on a first part of the silicon channel layer 12, and a first ferromagnetic layer 14A disposed on the first magnesium oxide film 13A. The first magnesium oxide film 13A partly includes a first lattice-matched part P lattice-matched with both of the silicon channel layer 12 and the first ferromagnetic layer 14A.

11 Claims, 10 Drawing Sheets (a)

(b)

SPIN INJECTION ELECTRODE STRUCTURE, SPIN TRANSPORT ELEMENT, AND SPIN TRANSPORT DEVICE

BACKGROUND OF THE INVENTION

1. Field of the Invention

The present invention relates to a spin injection electrode structure, a spin transport element, and a spin transport device.

2. Related Background Art

Techniques for accumulating spins in channels made of semiconductors have recently been known. The channels made of semiconductors have spin diffusion lengths much longer than those of channels made of metals. For example, the following Non Patent Literatures 1 to 4 disclose techniques for injecting spins into silicon.

Non Patent Literature 1: Tomoyuki Sasaki et al., "Electrical Spin Injection into Silicon Using MgO Tunnel Barrier," Applied Physics Express 2, The Japan Society of Applied Physics, 2009, p. 053003-1 to 053003-3.

Non Patent Literature 2: O. M. J. van't Erve et al., "Electrical injection and detection of spin-polarized carriers in silicon in a lateral transport geometry," APPLIED PHYSICS LETTERS 91, American Institute of Physics, 2007, p. 212109-1 to 212109-3.

Non Patent Literature 3: Y. Ando et al., "Electrical injection and detection of spin-polarized electrons in silicon through an $Fe_3Si/Si$ Schottky tunnel barrier," APPLIED PHYSICS LETTERS 94, American Institute of Physics, 2009, p. 182105-1 to 182105-3.

Non Patent Literature 4: Saroj P. Dash et al., "Electrical creation of spin polarization in silicon at room temperature," nature, Macmillan Publishers Limited, Nov. 26, 2009, vol. 462, p. 491-494.

SUMMARY OF THE INVENTION

For applying the injection, transport, and detection of spins to silicon, it has been desired to attain a sufficient output characteristic at room temperature. Though the above-mentioned Non Patent Literatures 1 to 3 report the injection, transport, and detection of spins in silicon, each is a phenomenon at a low temperature of 150 K or lower. The above-mentioned Non Patent Literature 4 observes spin accumulation in silicon at 300 K but no spin transport in silicon at room temperature, and thus cannot be expected to be applied widely at present. Thus, it has been desired to achieve effective injection which enables spin transport in silicon at room temperature.

For overcoming the problem mentioned above, it is an object of the present invention to provide a spin injection electrode structure, a spin transport element, and a spin transport device which enable effective spin injection in a silicon channel layer at room temperature.

For achieving the above-mentioned object, the spin injection electrode structure of the present invention comprises a silicon channel layer, a first magnesium oxide film disposed on a first part of the silicon channel layer, and a first ferromagnetic layer disposed on the first magnesium oxide film. The first magnesium oxide film partly includes a first lattice-matched part lattice-matched with both of the silicon channel layer and the first ferromagnetic layer.

In this spin injection electrode structure, the first magnesium oxide film is disposed between the silicon channel layer and the first ferromagnetic layer. The first magnesium oxide film partly has the first lattice-matched part lattice-matched with both of the silicon channel layer and the first ferromagnetic layer. Such a crystal morphology in the spin injection electrode structure enables efficient spin injection in the silicon channel layer at room temperature. This seems to result from the fact that the spin injection efficiency is improved by narrowing a spin injection current into the first lattice-matched part.

Preferably, the first lattice-matched part in the first magnesium oxide film has a volume ratio of 5 to 50% with respect to the total volume of the first magnesium oxide film. This can yield a higher spin polarization ratio.

Preferably, the first magnesium oxide film has a thickness of at least 0.6 nm but not exceeding 1.6 nm. When the first magnesium oxide film has a thickness of 1.6 nm or less, interface resistivity can be made lower with respect to the resulting spin output, so as to suppress noise, whereby spins can be injected favorably. When the first magnesium oxide film has a thickness of 0.6 nm or more, it can be used as a film uniformly formed on the silicon channel layer.

Preferably, an interface between the first lattice-matched part and the silicon channel layer has an area not greater than that of an interface between the first lattice-matched part and the first ferromagnetic layer. Such an areal relationship can further narrow the spin injection current into the first lattice-matched part, thereby improving the spin injection efficiency more.

Preferably, the first ferromagnetic layer has a crystal in a body-centered cubic (BCC) lattice structure. This enables the first ferromagnetic layer to grow epitaxially partly on the first magnesium oxide film.

Preferably, the first ferromagnetic layer is made of a metal selected from the group consisting of Co and Fe, an alloy containing at least one element of the group, or a compound containing at least one element selected from the group and B. These materials are ferromagnetic materials exhibiting high spin polarization and thus can favorably achieve a function as a spin injection electrode.

Preferably, the spin injection electrode structure further comprises an antiferromagnetic layer formed on the first ferromagnetic layer, while the antiferromagnetic layer pins a direction of magnetization of the first ferromagnetic layer. By exchange coupling with the first ferromagnetic layer, the antiferromagnetic layer can impart unidirectional anisotropy to the direction of magnetization of the first ferromagnetic layer. This makes the first ferromagnetic layer having a higher coercive force in one direction than in the case without the antiferromagnetic layer.

Preferably, the spin transport element in accordance with the present invention comprises any of the above-mentioned spin injection electrode structures and further a second magnesium oxide film disposed on a second part of the silicon channel layer and a second ferromagnetic layer disposed on the second magnesium oxide film, while the second magnesium oxide film partly includes a second lattice-matched part lattice-matched with both of the silicon channel layer and the second ferromagnetic layer. This lets an interaction of spins to occur as being narrowed into the second lattice-matched part, thereby increasing the spin detection efficiency. Preferably, the second magnesium oxide film has the same structure as that of the first magnesium oxide film, while the second ferromagnetic layer has the same structure as that of the first ferromagnetic layer.

Preferably, the first and second ferromagnetic layers are provided with a coercive force difference therebetween by shape anisotropy. In this case, an antiferromagnetic layer for providing a coercive force difference can be omitted.

In general, the silicon channel layer is implanted with ions for providing conductivity. The surface of the silicon channel layer may be damaged by the ion implantation. It is therefore preferred for the silicon channel layer to have a depression between the first and second parts, while the depression has a depth of at least 10 nm but not exceeding 20 nm. This makes it possible to use the silicon channel layer with suppressed surface damages.

The spin transport device preferably has the above-mentioned spin injection electrode structure, thereby making it possible to provide a spin transport device which enables effective spin injection in the silicon channel layer at room temperature.

The present invention can provide a spin injection electrode structure, a spin transport element, and a spin transport device which enable effective spin injection in a silicon channel layer at room temperature.

DESCRIPTION OF THE PREFERRED
EMBODIMENTS

Figure 1:
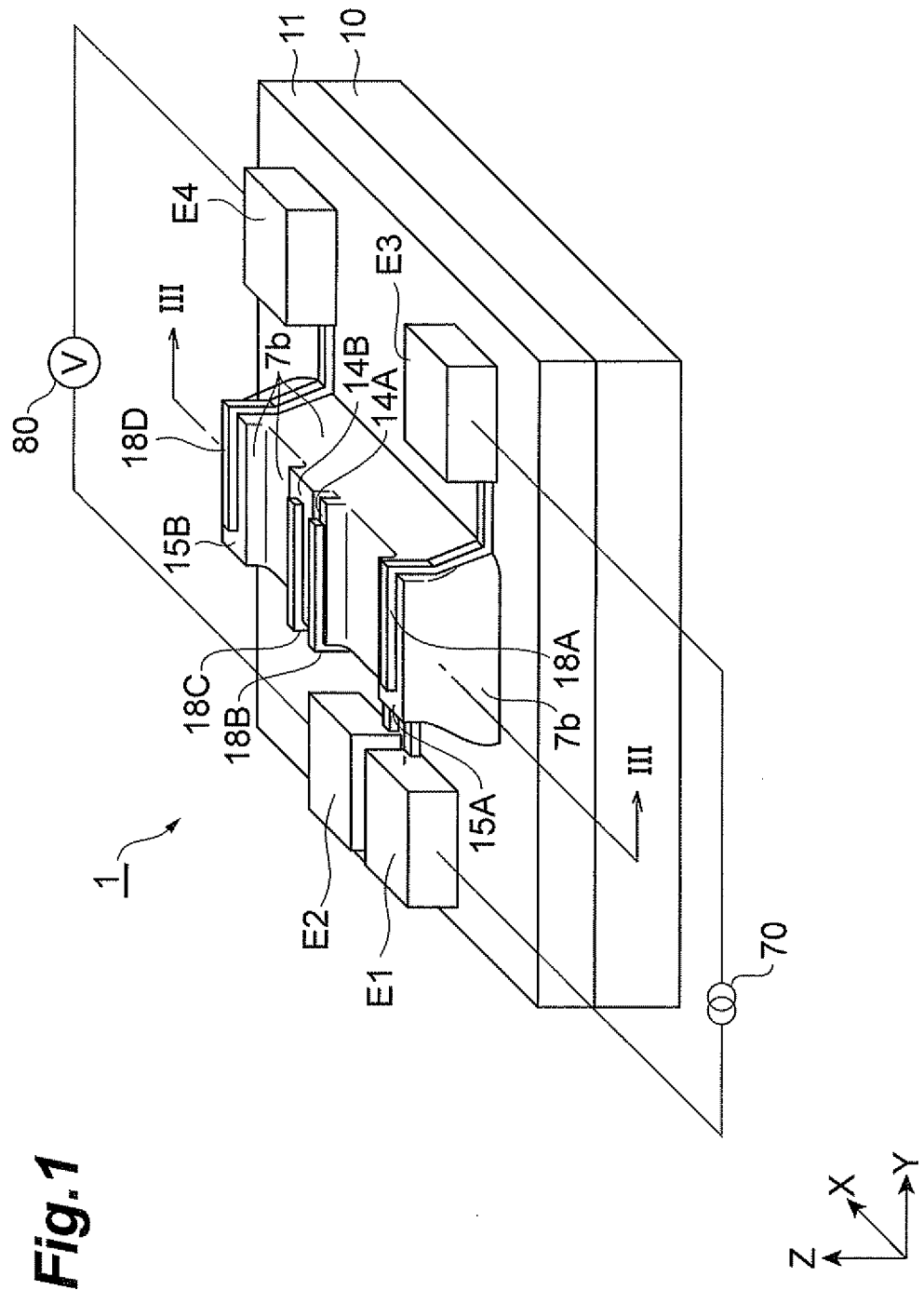
FIG. 1 is a perspective view of a spin transport element in accordance with an embodiment.
Figure 2:
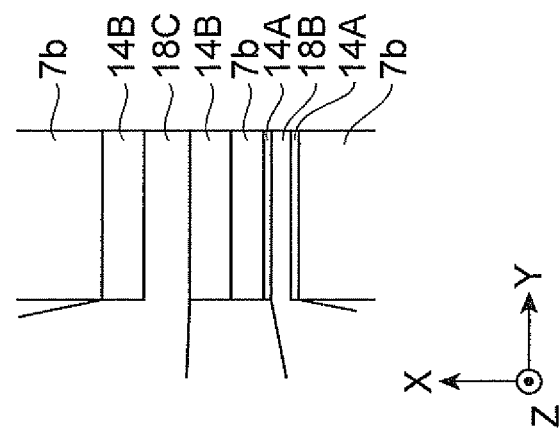
FIG. 2 is a top plan view of the spin transport element in accordance with the embodiment in part (a), while part (b) is an enlarged view of an area B illustrated in part (a)
Figure 2:
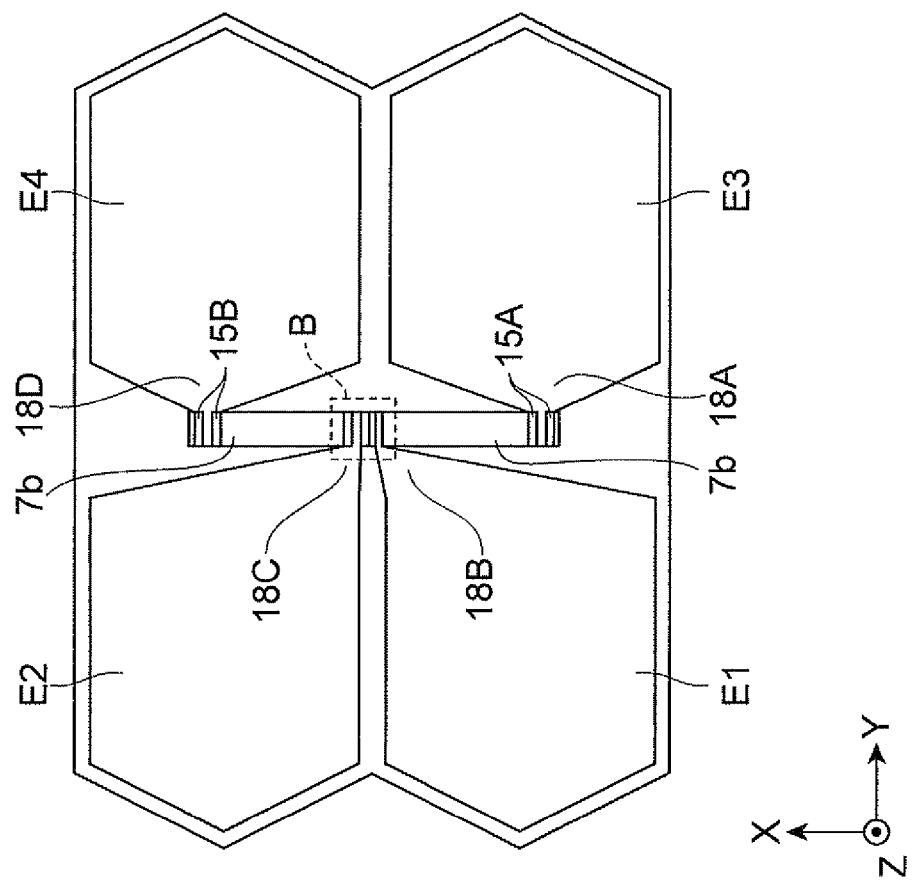
Figure 3:
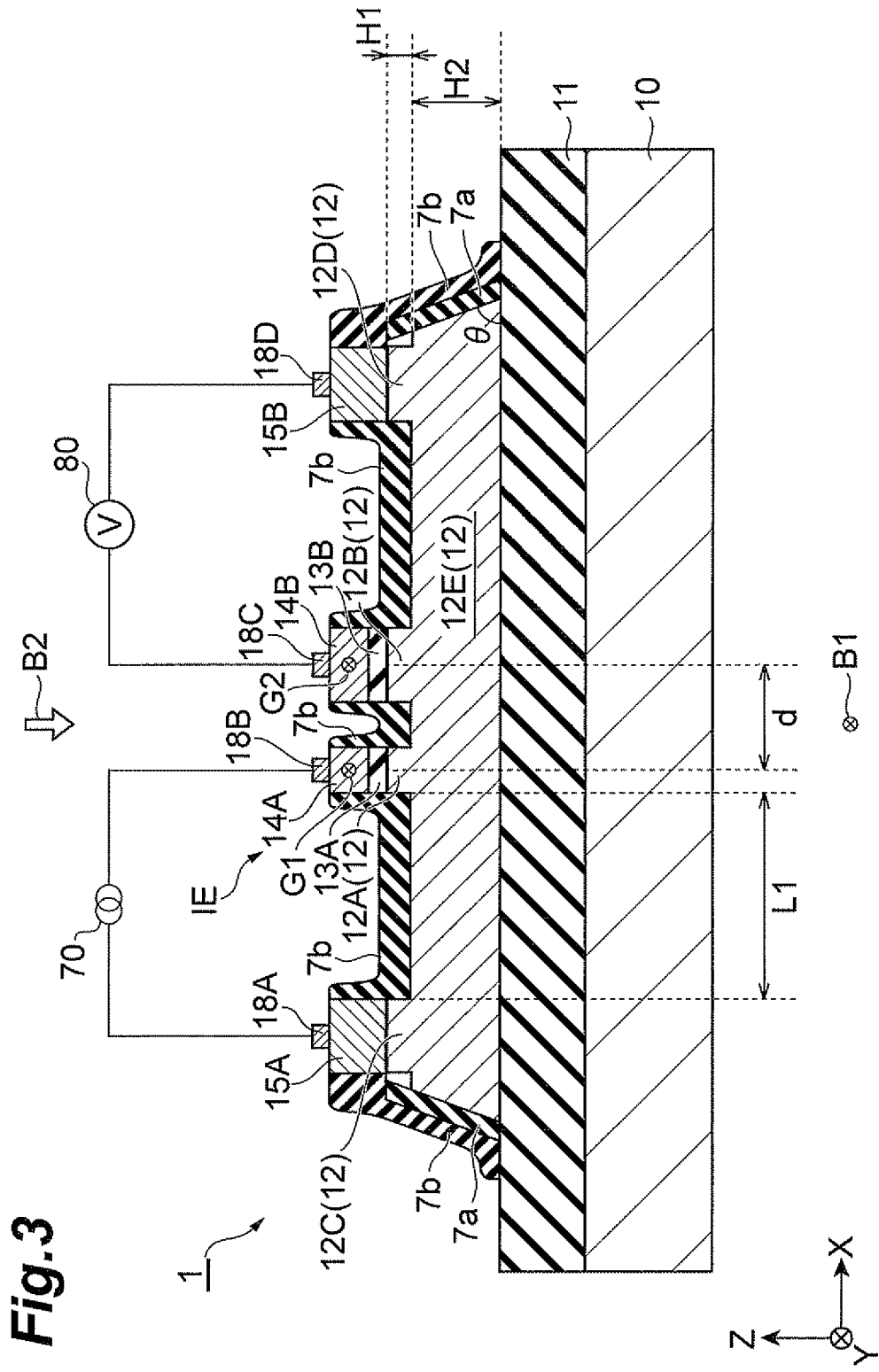
FIG. 3 is a sectional view taken along the line III-III of FIG. 1.

In the following, preferred embodiments of the spin transport element in accordance with the present invention will be explained in detail with reference to the drawings. The drawings show an XYZ orthogonal coordinate system when necessary. FIG. 1 is a perspective view of the spin transport element in accordance with this embodiment. Part (a) of FIG. 2 is a top plan view of the spin transport element in accordance with this embodiment. Part (b) of FIG. 2 is an enlarged view of an area B illustrated in part (a). FIG. 3 is a sectional view taken along the line of FIG. 1.

As illustrated in FIG. 3, a spin transport element 1 comprises a substrate 10, a silicon oxide film 11, a silicon channel layer 12, a first magnesium oxide film 13A, a second magnesium oxide film 13B, a first ferromagnetic layer 14A, a second ferromagnetic layer 14B, a first reference electrode 15A, a second reference electrode 15B, and oxide films 7a, 7b. The silicon channel layer 12, first magnesium oxide film 13A, and first ferromagnetic layer 14A constitute a spin injection electrode structure IE.

For example, SOI (Silicon On Insulator) substrates can be used as the substrate 10, silicon oxide film 11, and silicon channel layer 12. The silicon oxide film 11 is disposed on the substrate 10, which is a silicon substrate. The silicon oxide film 11 has a thickness of 200 nm, for example.

The silicon channel layer 12 functions as a layer for diffusing and transporting spins. The upper face of the silicon channel layer 12 is a (100) plane, for example. The silicon channel layer 12 has a rectangular form whose major axis lies along the X axis when seen in the Z axis (thickness direction), for example. The silicon channel layer 12, which is made of silicon, is doped with impurity ions, when necessary, in order to impart a conductivity thereto. The ion concentration is $5.0 \times 10^{19}$ cm$^{-3}$, for example. The thickness of the silicon channel layer 12 is 100 nm, for example. The silicon channel layer 12 may have such a structure that an ion concentration peak exists at a depth of 10 nm therein from the interface between the first magnesium oxide film 13A or second magnesium oxide film 13B and the silicon channel layer 12 in order to be able to adjust the Schottky barrier at this interface. When the ion concentration of the silicon channel layer 12 is low, a voltage may be applied to the silicon oxide film 11, so as to induce carriers in the silicon channel layer 12.

As illustrated in FIG. 3, the silicon channel layer 12 has tilted parts, whose angle of inclination θ is 50° to 60°, on its side faces. The angle of inclination θ is an angle formed between the bottom part and each side part of the silicon channel layer 12. The silicon channel layer 12 can be formed by wet etching.

As illustrated in FIG. 3, the silicon channel layer 12 includes a first projection (first part) 12A, a second projection (second part) 12B, a third projection (third part) 12C, a fourth projection (fourth part) 12D, and a main part 12E. The first projection 12A, second projection 12B, third projection 12C, and fourth projection 12D are parts extending such as to project from the main part 12E and are arranged in this order at predetermined intervals along a predetermined axis (the X axis in the example illustrated in FIG. 3).

The first projection 12A, second projection 12B, third projection 12C, and fourth projection 12D each have a thickness (length along the Z axis in the example illustrated in FIG. 3) H1 of 20 nm, for example. The main part 12E has a thickness (length along the Z axis in the example illustrated in FIG. 3) H2 of 80 nm, for example. The distance Li between the first projection 12A and third projection 12C is 100 μm or less, for example. Preferably, the distance d between the center part in the length along the X axis of the first projection 12A and the center part in the length along the X axis of the second projection 12B is not longer than the spin diffusion length. The spin diffusion length in the silicon channel layer 12 at room temperature (300 K) is 1 μm or less, for example. Spins injected from the first ferromagnetic layer 14A into the first projection 12A or those injected from the second ferromagnetic layer 14B into the second projection 12B are diffused/transported in a region between the first and second projections 12A, 12B in the main part 12E.

The first and second magnesium oxide films 13A, 13B function as tunnel insulating films for efficiently connecting the spin polarization of ferromagnetic bodies (first and second ferromagnetic layers 14A, 14B) and the spin polarization of the silicon channel layer 12 to each other. The first magnesium oxide film 13A is disposed on the first projection 12A serving as the first part of the silicon channel layer 12. The second magnesium oxide film 13B is disposed on the second projection 12B serving as the second part of the silicon channel layer 12. The first and second magnesium oxide films 13A, 13B have grown their crystals on a (100) plane, for example, of the silicon channel layer 12. Since the first or second magnesium oxide film 13A or 13B is provided, a large number of spin-polarized electrons can be injected from the first or second ferromagnetic layer 14A or 14B into the silicon channel layer 12, so as to enhance the electric potential output of the spin transport element 1.

Preferably, the first and second magnesium oxide films 13A, 13B each have a thickness of 1.6 nm or less. This can yield a low interface resistivity of 100 k$\Omega\mu cm^2$ or less with respect to the resulting spin output and thus can favorably inject and output spins. In view of one atomic layer thickness, the thickness of the first and second magnesium oxide films 13A, 13B is preferably 0.6 nm or greater. This makes it possible to use the first and second magnesium oxide films 13A, 13B uniformly formed on the silicon channel layer 12.

One of the first and second ferromagnetic layers 14A, 14B functions as an electrode for injecting spins into the silicon channel layer 12, while the other functions as an electrode for detecting spins within the silicon channel layer 12. The first ferromagnetic layer 14A is disposed on the first magnesium oxide film 13A. The second ferromagnetic layer 14B is disposed on the second magnesium oxide film 13B.

The first and second ferromagnetic layers 14A, 14B are made of a ferromagnetic material. An example of materials for the first and second ferromagnetic layers 14A, 14B is a metal selected from the group consisting of Co and Fe, an alloy containing at least one element of the group, or a compound constituted by at least one element selected from the group and B. Preferably, the first and second ferromagnetic layers 14A, 14B have crystals in a body-centered cubic lattice structure. This enables the first and second ferromagnetic layers to grow epitaxially partly on the first and second magnesium oxide films, respectively.

In the example illustrated in FIG. 1, each of the first and second ferromagnetic layers 14A, 14B has a rectangular parallelepiped form whose major axis lies along the Y axis. Preferably, the first and second ferromagnetic layers 14A, 14B are provided with a coercive force difference therebetween by their shape anisotropy. The first ferromagnetic layer 14A has a width (length along the X axis) of about 350 nm, for example. The second ferromagnetic layer 14B has a width (length along the X axis) of about 2 μm, for example. In the example illustrated in FIG. 1, the first ferromagnetic layer 14A has a coercive force greater than that of the second ferromagnetic layer 14B.

The first and second reference electrodes 15A, 15B have functions as an electrode for causing a detection current to flow into the silicon channel layer 12 and an electrode for reading the output caused by spins. The first reference electrode 15A is disposed on the third projection 12C of the silicon channel layer 12. The second reference electrode 15B is disposed on the fourth projection 12D of the silicon channel layer 12. The first and second reference electrodes 15A, 15B are made of a conductive material, an example of which is a nonmagnetic metal such as Al which exhibits low resistance with respect to Si.

The oxide film 7a is formed on the side faces of the silicon channel layer 12. The oxide film 7b is formed on the side faces of the silicon channel layer 12, oxide film 7a, first magnesium oxide film 13A, second magnesium oxide film 13B, first ferromagnetic layer 14A, second ferromagnetic layer 14B, first reference electrode 15A, and second reference electrode 15B. The oxide film 7b is also formed on the main part 12E that is free from the first ferromagnetic layer 14A, second ferromagnetic layer 14B, first reference electrode 15A, and second reference electrode 15B on the upper face of the silicon channel layer 12. The oxide film 7b is disposed on the main part 12E of the silicon channel layer 12 between the first and second magnesium oxide films 13A, 13B. The oxide film 7b functions as a protective film for the silicon channel layer 12, first magnesium oxide film 13A, second magnesium oxide film 13B, first ferromagnetic layer 14A, second ferromagnetic layer 14B, first reference electrode 15A, and second reference electrode 15B and inhibits them from deteriorating. An example of the oxide film 7b is a silicon oxide film.

As illustrated in FIG. 1, a lead 18A is disposed on the first reference electrode 15A and the oxide film 7b (the tilted side face of the silicon channel layer 12). Similarly, a lead 18B is disposed on the first ferromagnetic layer 14A and the oxide film 7b. A lead 18C is disposed on the second ferromagnetic layer 14B and the oxide film 7b. A lead 18D is disposed on the second reference electrode 15B and the oxide film 7b. The leads 18A to 18D are made of a conductive material such as Cu. When leads are disposed on the oxide film 7b, spins transported through the silicon channel layer 12 are inhibited from being absorbed by the leads. Placing the leads on the oxide film 7b can also restrain currents from flowing from the leads into the silicon channel layer 12 and improve the spin injection efficiency. Measurement electrode pads E1 to E4 are disposed at respective end parts of the leads 18A to 18D. The end parts of the leads 18A to 18D and the measurement electrode pads E1 to E4 are formed on the silicon oxide film 11. The electrode pads E1 to E4 are made of a conductive material such as Au.

Figure 4:
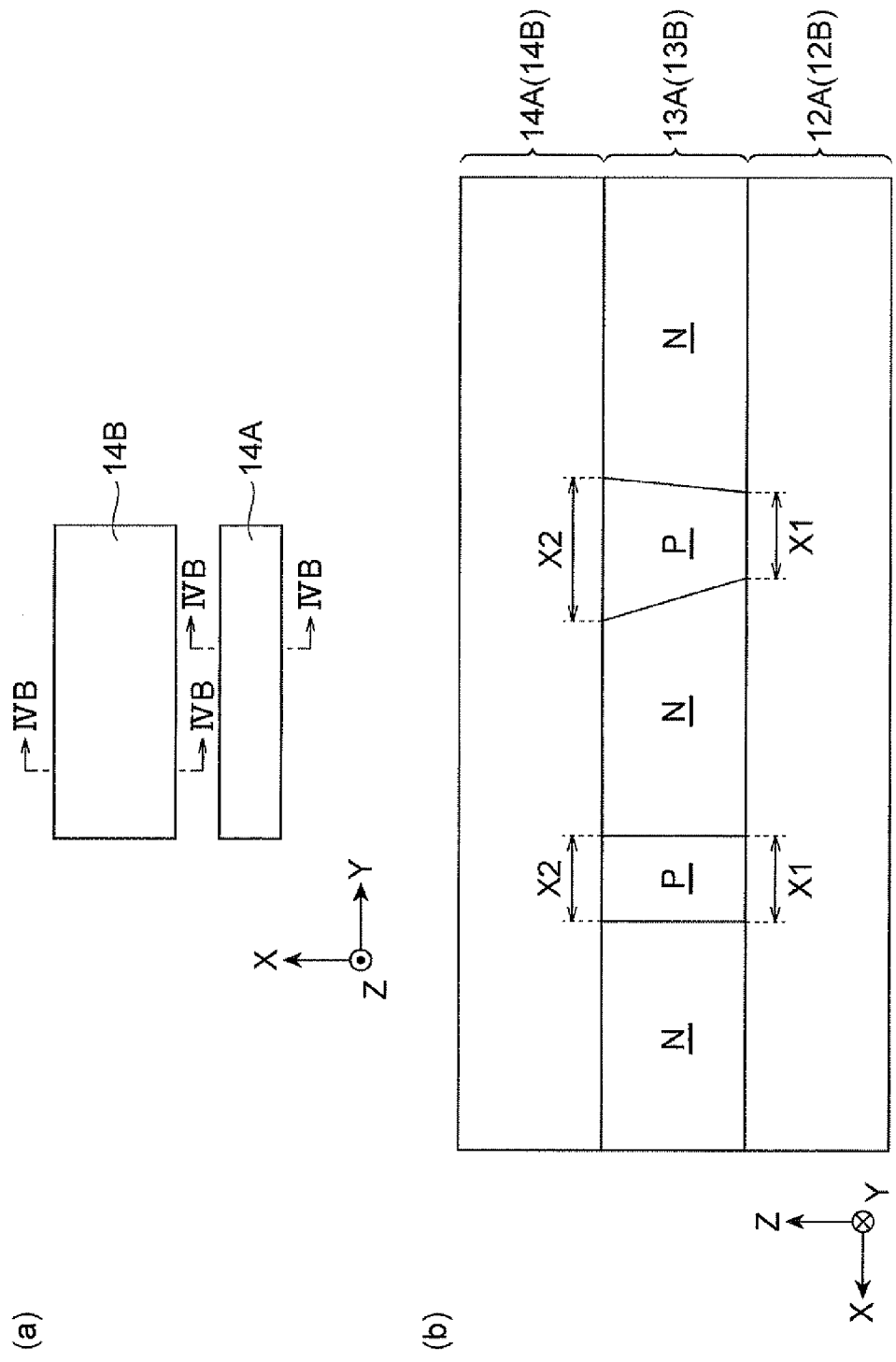
FIG. 4 is a top plan view of a first ferromagnetic layer 14A and a second ferromagnetic layer 14B in part (a), while part (b) is a sectional view illustrating the crystal morphology of a spin injection electrode structure taken along the line IVB-IVB of part (a)

Part (a) of FIG. 4 is a top plan view of the first and second ferromagnetic layers 14A, 14B, while part (b) of FIG. 4 is a sectional view illustrating the crystal morphology of the spin injection electrode structure taken along the line IVB-IVB of part (a). The spin injection electrode structure IE has a structure in which the first magnesium oxide film 13A (or second magnesium oxide film 13B) and the first ferromagnetic layer 14A (or second ferromagnetic layer 14B) are stacked on a (100) plane, for example, of the silicon channel layer 12. The first magnesium oxide film 13A partly includes a part (first lattice-matched part) P lattice-matched with both of the silicon channel layer 12 and first ferromagnetic layer 14A. By "partly includes a lattice-matched part P" is meant that at least a part of the first magnesium oxide film 13A includes a part not lattice-matched with both of the silicon channel layer 12 and first ferromagnetic layer 14A. More specifically, the first magnesium oxide film 13A has a mixture of parts (first lattice-matched parts) P lattice-matched with both of the first projection 12A of the silicon channel layer 12 and the first ferromagnetic layer 14A and parts (first lattice-unmatched parts) N not lattice-matched with both of the first projection 12A of the silicon channel layer 12 and the first ferromagnetic layer 14A. The first lattice-unmatched parts N seem to be amorphous parts of the first magnesium oxide film 13A or parts where crystal portions having a crystal orientation shifted by 45° from the crystal orientation within a plane of the first lattice-matched part P exist on an amorphous layer.

Similarly, the second magnesium oxide film 13B partly includes a part (second lattice-matched part) P lattice-matched with both of the silicon channel layer 12 and second ferromagnetic layer 14B. By "partly includes a lattice-matched part P" is meant that at least a part of the second magnesium oxide film 1313 includes a part not lattice-matched with both of the silicon channel layer 12 and second ferromagnetic layer 14B. More specifically, the second magnesium oxide film 13B has a mixture of parts (second lattice-matched parts) P lattice-matched with both of the second projection 1213 of the silicon channel layer 12 and the second ferromagnetic layer 1413 and parts (second lattice-unmatched parts) N not lattice-matched with both of the second projection 1213 of the silicon channel layer 12 and the second ferromagnetic layer 1413. The second lattice-unmatched parts N seem to be amorphous parts of the second magnesium oxide film 13B or parts where crystal portions having a crystal orientation shifted by 45° from the crystal orientation within a plane of the second lattice-matched part P exist on an amorphous layer.

Preferably, the first lattice-matched parts P in the first magnesium oxide film 13A have a volume ratio of 5 to 50% with respect to the total volume of the first magnesium oxide film 13A. Similarly, it is preferred for the second lattice-matched parts P in the second magnesium oxide film 13B to have a volume ratio of 5 to 50% with respect to the total volume of the second magnesium oxide film 13B. Such a volume ratio can yield a higher spin polarization ratio. When the volume ratio is less than 5%, substantially the whole first magnesium oxide film 13A or second magnesium oxide film 13B is in an amorphous state and thus lowers the spin polarization ratio. When the volume ratio exceeds 50%, a major part of the first magnesium oxide film 13A or second magnesium oxide film 13B is a monocrystal part and thus lowers the spin polarization ratio.

By "lattice-matched" is meant a state where the continuity of crystal lattices is maintained at an interface between two layers adjacent to each other. In a strict sense, it represents a state where, while the continuity is maintained, crystal lattices of two layers adjacent to each other are distorted in the vicinity of the interface between the two layers in conformity to those of their adjacent layers to such an extent that each layer can keep a stable crystal lattice. By "lattice-unmatched" is meant a state where crystal lattices are discontinuous at the interface between two layers adjacent to each other and indicates a state where, at the interface between the two layers adjacent to each other, a lattice buffer layer is formed by an amorphous layer, or crystals having different orientations are joined together so as to form a crystal grain boundary, for example.

As illustrated in part (b) of FIG. 4, the crystal growth of the first magnesium oxide film 13A (or second magnesium oxide film 13B) on the silicon channel layer 12 is performed while using a crystal on the outermost surface of the silicon channel layer 12 as a seed. Specifically, in the example represented by the first lattice-matched part (or second lattice-matched part) P on the left side in part (b) of FIG. 4, the film is epitaxially grown like a rod in the film forming direction. In this case, the width X1 in the interface between the first projection 12A (or second projection 12B) of the silicon channel layer 12 and the first magnesium oxide film 13A (or second magnesium oxide film 13B) is on a par with the width X2 in the interface between the first ferromagnetic layer 14A (or second ferromagnetic layer 14B) and the first magnesium oxide film 13A (or second magnesium oxide film 13B).

In the example represented by the first lattice-matched part (or second lattice-matched part) P on the right side in part (b) of FIG. 4, the film is epitaxially grown such as to yield a larger crystallized area in the latter half of crystal growth. In this case, the width X2 in the interface between the first magnesium oxide film 13A (or second magnesium oxide film 13B) and the first ferromagnetic layer 14A (or second ferromagnetic layer 14B) is greater than the width X1 in the interface between the first magnesium oxide film 13A (or second magnesium oxide film 13B) and the first projection 12A (or second projection 12B) of the silicon channel layer 12. The area of the interface between the first lattice-matched part (or second lattice-matched part) P and the first projection 12A (or second projection 12B) of the silicon channel layer 12 is not greater than that of the interface between the first lattice-matched part (or second lattice-matched part) P and the first ferromagnetic layer 14A (or second ferromagnetic layer 14B). Such an areal relationship can further narrow the spin injection current into the first lattice-matched part (or second lattice-matched part) P, thereby improving the spin injection efficiency more.

Figure 5:
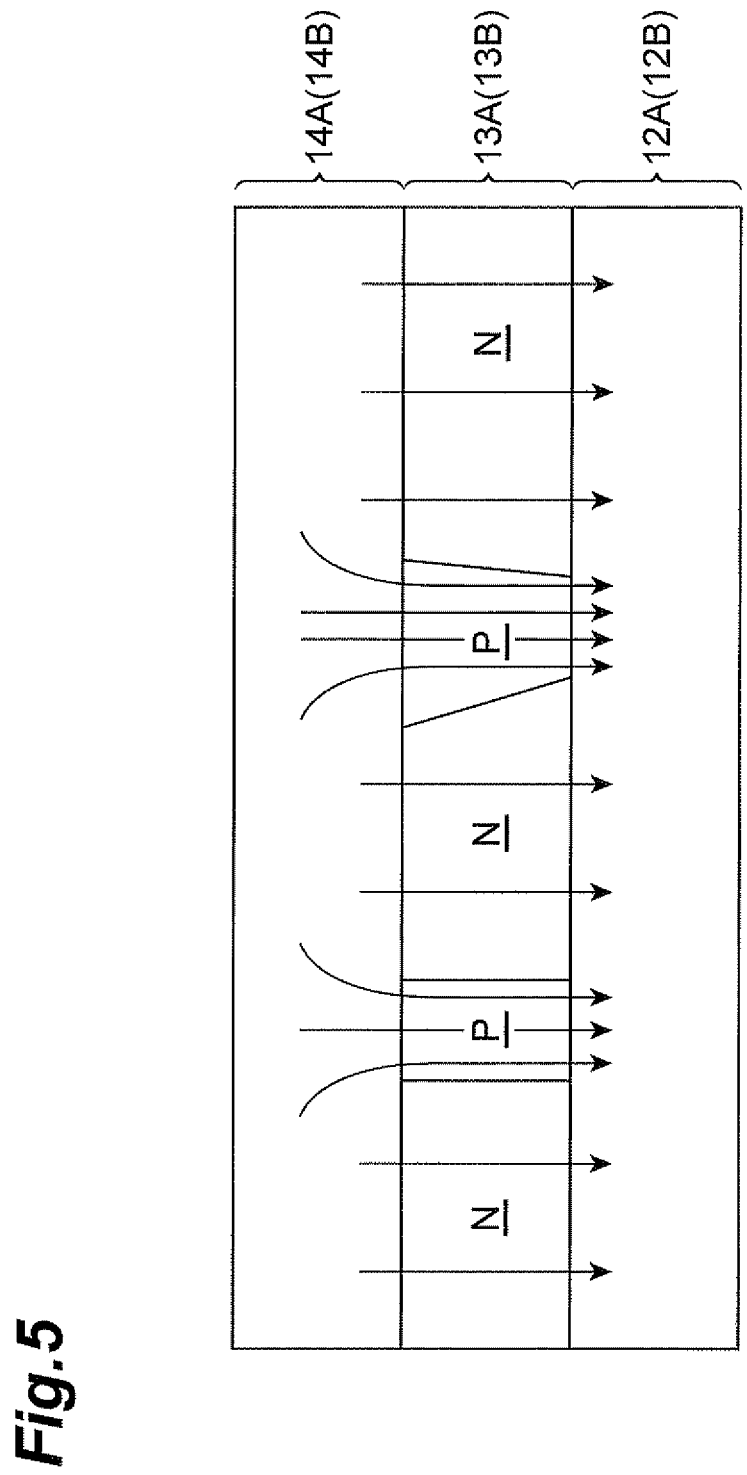
FIG. 5 is a schematic diagram illustrating spin injection by the crystal morphology of the spin injection electrode structure in accordance with this embodiment.

FIG. 5 is a schematic diagram illustrating spin injection by the crystal morphology of the spin injection electrode structure IE in accordance with this embodiment. As explained above, the first magnesium oxide film 13A (or second magnesium oxide film 13B) has a mixture of first lattice-matched parts (or second lattice-matched parts) P and first lattice-unmatched parts (or second lattice-unmatched parts) N. Therefore, it is inferred that the spin injection current flows from the first ferromagnetic layer 14A into the silicon channel layer 12 through the first magnesium oxide film 13A, while the first lattice-matched parts (or second lattice-matched parts) P have less distorted crystal lattices and thus yield lower resistance as compared with the first lattice-unmatched parts (or second lattice-unmatched parts) N, thereby narrowing the current having a higher spin polarization ratio. This seems to improve the spin injection efficiency. Through the second magnesium oxide film 13B, the second lattice-matched parts P having favorable spin transport efficiency become predominant between the second ferromagnetic layer 14B and the second projection 12B. This seems to improve the spin detection efficiency. Therefore, the fact that the spin injection electrode structure IE or spin transport element 1 has such a crystal morphology enables effective spin injection in the silicon channel layer at room temperature.

A method of epitaxially growing a magnesium oxide film all over a silicon channel layer and causing a coherent tunnel current to flow, thereby injecting spins from a ferromagnetic layer into the silicon channel layer, has been considered as an effective technique for injecting spins into the silicon channel layer. However, there have been no examples having succeeded in epitaxially growing the magnesium oxide film all over the silicon channel layer.

An example of operations for the spin transport element 1 in accordance with this embodiment to use an NL (nonlocal) measurement method will now be explained. In the NL measurement method, as illustrated in FIG. 3, the spin transport element 1 detects an external magnetic field B1 in the Y direction, for example. The direction of magnetization G1 (Y direction) of the first ferromagnetic layer 14A is pinned to the same direction as with the direction of magnetization G2 (Y direction) of the second ferromagnetic layer 14B. As illustrated in FIG. 1, the electrode pads E1 and E3 are connected to an AC current source 70, so as to cause a detection current to flow into the first ferromagnetic layer 14A. The detection current flows from the first ferromagnetic layer 14A, which is a ferromagnetic body, into the nonmagnetic silicon channel layer 12 through the first magnesium oxide film 13A, whereby electrons having spins corresponding to the direction of magnetization G1 of the first ferromagnetic layer 14A are injected into the silicon channel layer 12. The injected spins diffuse to the second ferromagnetic layer 14B side. Thus can be achieved is a structure in which the current and spin flow flowing through the silicon channel layer 12 are mainly directed along a predetermined axis (X axis). Then, an interaction between the direction of magnetization, i.e., spin of electrons, of the first ferromagnetic layer 14A changed by the external magnetic field B1 and the spin of electrons in the part of the silicon channel layer 12 in contact with the second ferromagnetic layer 14B generates an output between the silicon channel layer 12 and the second ferromagnetic layer 14B. This output is detected by an output meter 80 connected to the electrode pads E2, E4.

An example of operations for the spin transport element 1 in accordance with this embodiment to use an NL-Hanle measurement method will now be explained. The Hanle measurement method utilizes the Hanle effect. The Hanle effect is a phenomenon in which a spin, which has been injected from a ferromagnetic electrode into a channel by a current, generates a Larmor precession at the time of being diffused/transported to another ferromagnetic electrode when an external magnetic field is applied thereto in a direction perpendicular to the direction of the spin. In the NL-Hanle measurement method, as illustrated in FIG. 3, the spin transport element 1 detects an external magnetic field B2 in the Z direction, for example. The direction of magnetization G1 (Y direction) of the first ferromagnetic layer 14A is pinned to the same direction as with the direction of magnetization G2 (Y direction) of the second ferromagnetic layer 14B. Then, connecting the first ferromagnetic layer 14A and the first reference electrode 15A to the AC current source 70 allows a spin detection current to flow into the first ferromagnetic layer 14A. The current flows from the first ferromagnetic layer 14A, which is a ferromagnetic body, into the nonmagnetic silicon channel layer 12 through the first magnesium oxide film 13A, whereby electrons having spins corresponding to the direction of magnetization G1 of the first ferromagnetic layer 14A are injected into the first projection 12A of the silicon channel layer 12. The spins injected in the first projection 12A diffuse to the ferromagnetic layer 14 side through the main part 12E. Thus achieved is a structure in which the current and spin flow flowing through the silicon channel layer 12 are mainly directed along the X axis.

When the external magnetic field B2 is not applied to the silicon channel layer 12, i.e., when the external magnetic field is zero, the direction of spins diffusing through the region between the first and second ferromagnetic layers 14A, 14B in the silicon channel layer 12 does not rotate. Therefore, the spins oriented in the preset direction of magnetization G2 of the second ferromagnetic layer 14B diffuse into the region on the second ferromagnetic layer 14B side in the silicon channel layer 12. Hence, when the external magnetic field is zero, outputs (e.g., resistance output and voltage output) take extrema. They can be maxima or minima depending on directions of currents and magnetizations. The outputs can be evaluated by the output meter 80 such as a voltmeter connected to the second ferromagnetic layer 14B and second reference electrode 15B.

A case of applying the external magnetic field B2 to the silicon channel layer 12 will now be considered. The external magnetic field B2 is applied in a direction (Z direction in the example of FIG. 3) which is perpendicular to the direction of magnetization G1 (Y direction in the example of FIG. 3) of the first ferromagnetic layer 14A and the direction of magnetization G2 (Y direction in the example of FIG. 3) of the second ferromagnetic layer 14B. When the external magnetic field B2 is applied, the direction of spins diffused/transported through the silicon channel layer 12 rotate about the axial direction of the external magnetic field B2 (Z direction in the case of FIG. 3) (so-called Hanle effect). Outputs (e.g., resistance output and voltage output) at the interface between the silicon channel layer 12 and the second ferromagnetic layer 14B are determined by the relative angle between the direction of rotation of spins diffused to the region on the second ferromagnetic layer 14B side in the silicon channel layer 12 and the preset direction of magnetization G2 of the second ferromagnetic layer 14B, i.e., the direction of spins. When the external magnetic field B2 is applied, the direction of spins diffused through the silicon channel layer 12 rotates and thus deviates from the direction of magnetization of the second ferromagnetic layer 14B. Thus, outputs taking maxima when the external magnetic field is zero become maxima or lower when the external magnetic field B2 is applied. Outputs taking minima when the external magnetic field is zero become minima or greater when the external magnetic field B2 is applied.

Therefore, in the NL-Hanle measurement method, the outputs exhibit peaks when the external magnetic field is zero and decrease as the external magnetic field B2 is raised or lowered. That is, the outputs vary depending on whether the external magnetic field B2 exists or not, whereby the spin transport element 1 in accordance with this embodiment can be used as a magnetic sensor, for example.

Though a preferred embodiment of the present invention has been explained in detail in the foregoing, the present invention is not limited to the above-mentioned embodiment. The silicon channel layer 12 is implanted with ions for providing conductivity. The ion implantation may damage the surface of the silicon channel layer 12. It is therefore preferred for the silicon channel layer 12 to be milled from the surface toward the bottom part. Preferably, the silicon channel layer has a depression between the first and second parts, while the depression has a depth of at least 10 nm. This can yield the silicon channel layer 12 with suppressed surface damages.

The direction of magnetization of the second ferromagnetic layer 14B may be pinned by an antiferromagnetic layer disposed on the second ferromagnetic layer 14B. This makes the second ferromagnetic layer 14B having a higher coercive force in one direction than in the case without the antiferromagnetic layer. Preferably, the magnetic field for pinning the direction of magnetization of the second ferromagnetic layer 14B is greater than the external magnetic field B1, B2 to be evaluated. This allows the external magnetic field B1, B2 to be detected stably. Preferably, in the NL-Hanle measurement method, the first and second ferromagnetic layers 14A, 14B have about the same coercive force in the same direction because of the antiferromagnetic layer.

A magnetic detector comprising a plurality of spin transport elements 1 may be provided. For example, a plurality of spin transport elements 1 may be arranged parallel or stacked, so as to construct a magnetic detector. In this case, the respective outputs of the spin transport elements 1 may be combined together. Such a magnetic detector can be employed in biosensors for detecting cancer cells, for example.

The above-mentioned spin injection electrode structure IE and spin transport element 1 can be used in various spin transport devices such as magnetic heads, magnetoresistive memories (MRAM), logic circuits, nuclear spin memories, and quantum computers, for example.

The spin detection units (the second ferromagnetic layer 14B, the second magnesium oxide film 13B, and the second projection 12B of the silicon channel layer 12) are not limited to their structures in the above-mentioned embodiment but may be those detecting spins by causing a current to flow.

Examples, which do not limit the present invention, will now be explained.

EXAMPLE 1

First, an SOI substrate constituted by a substrate, an insulating film, and a silicon film was prepared. A silicon substrate and a silicon oxide layer having a thickness of 200 nm were used as the substrate and the insulating film, respectively, while the thickness of the silicon film was 100 nm. The silicon film was implanted with ions for providing conductivity. Thereafter, impurities were diffused by annealing at 900° C., so as to adjust the electron concentration in the silicon film. Here, the average electron concentration of the silicon film as a whole was set to $5.0\times10^{19}$ cm$^{-3}$.

Subsequently, RCA cleaning was used for removing attachments, organic matters, and naturally oxidized films from the surface of the SOT substrate. Thereafter, an HF cleaning liquid was used, so as to terminate the surface of the SOT substrate with hydrogen. Then, the SOT substrate was brought into a molecular beam epitaxy (MBE) system. The base degree of vacuum (the degree of vacuum before actually performing stacking within the system) was set to $2.0\times10^{-9}$ Torr or less. The SOT substrate was heated, so as to perform flushing. This detached hydrogen from the surface of the silicon film and formed a clean surface.

Next, using the MBE method, a magnesium oxide film, an iron film, and a titanium film were formed in this order on the silicon film, so as to yield a multilayer body. The degree of vacuum at the time of forming the films was $5\times10^{-8}$ Torr or less. The titanium film was a cap layer for inhibiting the iron film from worsening characteristics upon oxidation. Here, crystal structures were determined in the silicon film, magnesium oxide film, and iron film by XRD measurement in the in-plane and out-of-plane methods.

Then, after cleaning the surface of the multilayer body, the substrate was formed with a Ta alignment mark by photolithography and liftoff. Subsequently, using a mask, the silicon film was patterned by anisotropic wet etching. This yielded a silicon channel layer 12 having tilted parts on its side faces. Here, the size of the silicon channel layer 12 was 23 μm×300 μm. The side faces of thus obtained silicon channel layer 12 were oxidized, so as to form a silicon oxide film (oxide film 7a).

Next, using photolithography, the iron film was patterned, so as to form first and second ferromagnetic layers 14A 14B. The oxide and magnesium films were removed from locations other than between the silicon channel layer 12 and the first and second ferromagnetic layers 14A, 14B. This yielded first and second magnesium oxides 13A, 13B. Al films were formed on one end side and the other end side of the exposed silicon channel layer 12, so as to produce first and second reference electrodes 15A, 15B, respectively.

Further, using ion milling and etching, the silicon channel layer 12 was dug by a depth of 20 nm from the surface thereof in the part free of the first ferromagnetic layer 14A, second ferromagnetic layer 14B, first reference electrode 15A, and second reference electrode 15B in the surface of the silicon channel layer 12. As a consequence, the silicon channel layer 12 attained a structure including a first projection 12A, a second projection 12B, a third projection 12C, a fourth projection 12D, and a main part 12E. The first projection 12A, second projection 12B, third projection 12C, and fourth projection 12D are parts which are arranged in this order at predetermined intervals along the X axis and extend so as to project from the main part 12E. Each of the first projection 12A, second projection 12B, third projection 12C, and fourth projection 12D had a thickness H1 of 10 nm. Such a structure eliminated the surface damages formed upon ion implantation for providing conductivity in the silicon film to become the silicon channel layer 12.

Furthermore, a silicon oxide film (oxide film 7b) was formed on the side faces of the first magnesium oxide film 13A, second magnesium oxide film 13B, first ferromagnetic layer 14A, second ferromagnetic layer 14B, first reference electrode 15A, and second reference electrode 15B, and on the main part 12E free of the first ferromagnetic layer 14A, second ferromagnetic layer 14B, first reference electrode 15A, and second reference electrode 15B in the upper face of the silicon channel layer 12.

Figure 6:
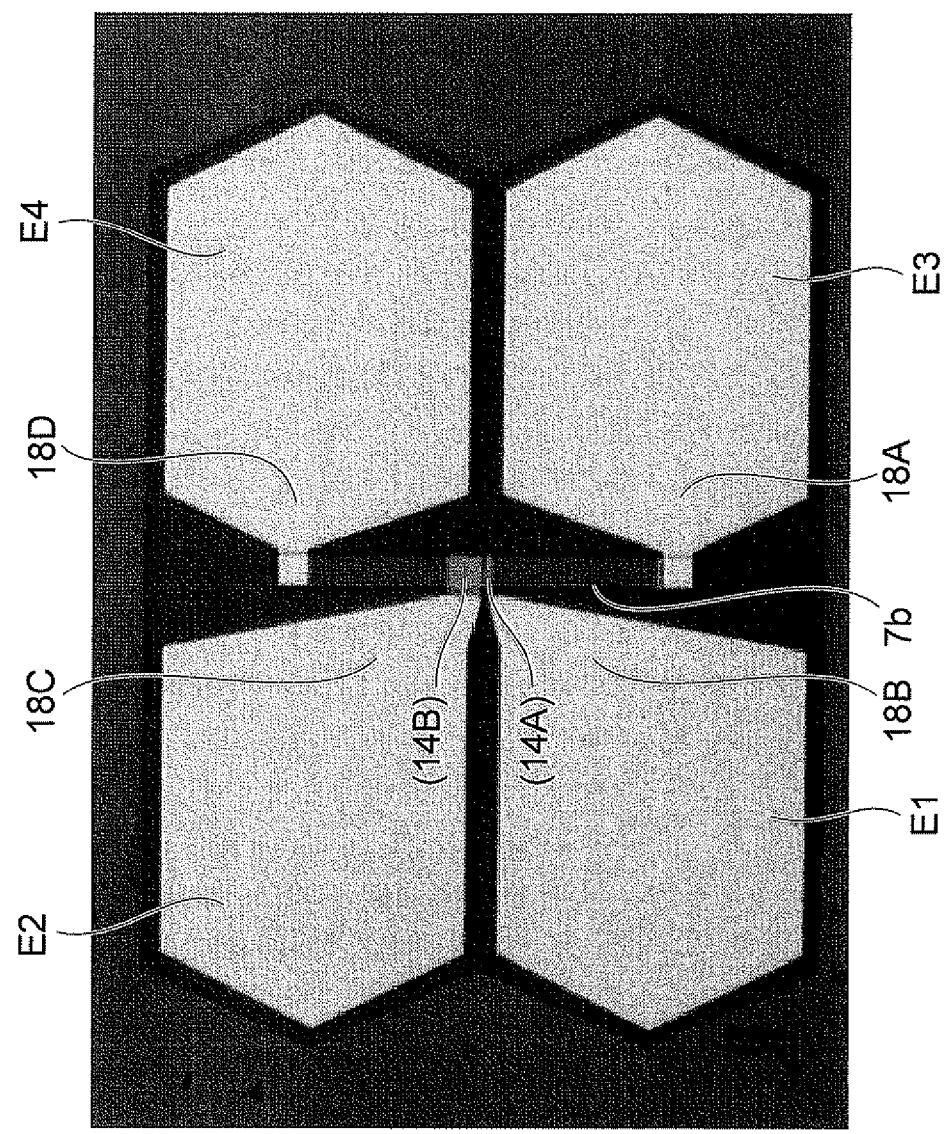
FIG. 6 is a top plan photographic view of the spin transport element produced by Example 1.

Next, leads 18A to 18D were formed on the first ferromagnetic layer 14A, second ferromagnetic layer 14B, first reference electrode 15A, and second reference electrode 15B, respectively. A multilayer structure constituted by Ta (having a thickness of 10 mm), Cu (having a thickness of 50 nm), and Ta (having a thickness of 10 nm) was used for each of the leads 18A to 18D. Electrode pads E1 to E4 were formed at respective end parts of the leads 18A to 18D. A multilayer structure constituted by Cr (having a thickness of 50 nm) and Au (having a thickness of 150 nm) was used as each of the electrode pads E1 to E4. Thus, a spin transport element of Example 1 having the same structure as with the spin transport element 1 illustrated in FIGS. 1 to 3 was produced. FIG. 6 illustrates a top plan photographic view of the spin transport element produced by Example 1.

Results of XRD Measurement

Figure 7:
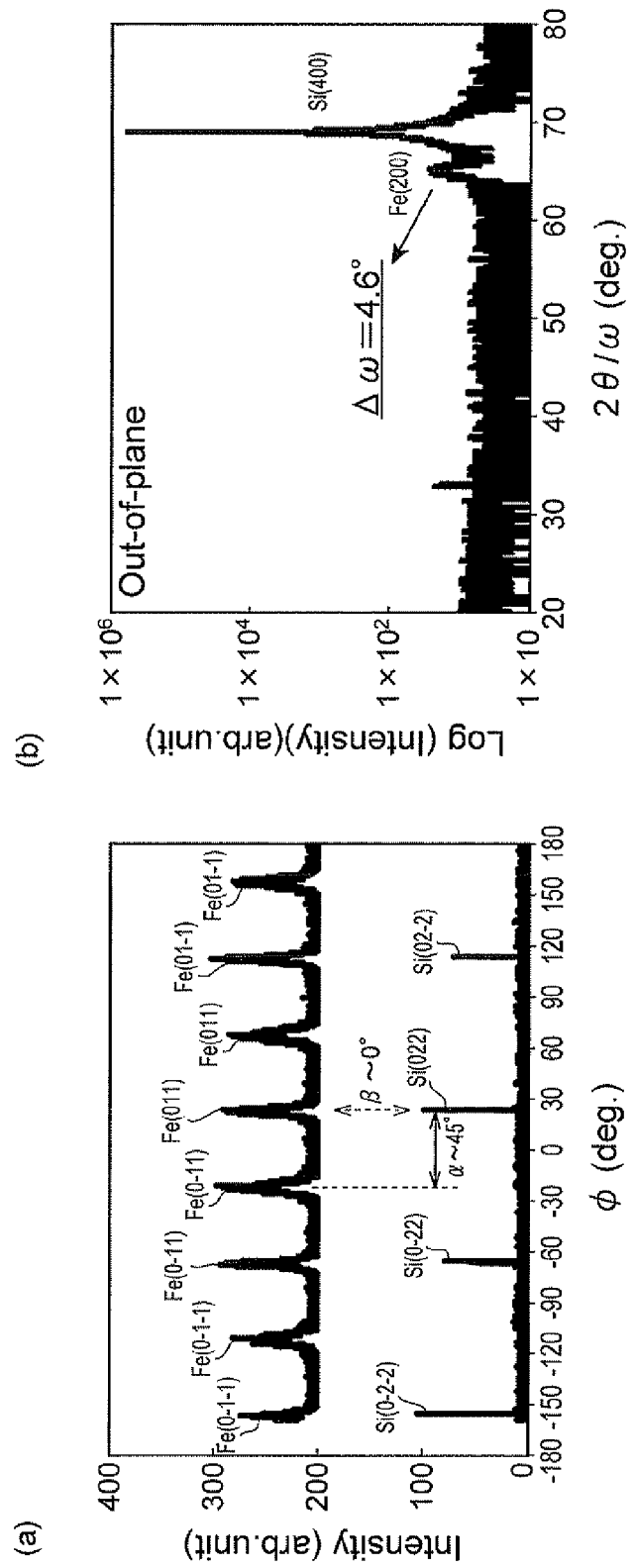
FIG. 7 is a graph illustrating XRD measurement results in an in-plane method in part (a), while part (b) is a graph illustrating XRD measurement results in an out-of-plane method.

FIG. 7 illustrates XRD measurement results of crystal structures of the above-mentioned silicon film, magnesium oxide film, and iron film. The magnesium oxide film has such a small thickness that no peaks attributable to the magnesium oxide film appear in FIG. 7.

First, part (b) of FIG. 7 is a graph illustrating XRD measurement results in the out-of-plane method. The out-of-plane method is a technique for evaluating a lattice plane parallel to a sample surface. The abscissa and ordinate in part (b) of FIG. 7 indicate 2θ/ω (deg.) and logarithm of intensity (arb. unit), respectively. Here, 2θ is the angle formed between an incident X-ray and a diffracted X-ray, while ω indicates the angle formed between the incident X-ray and the surface of the evaluated sample. As illustrated in part (b) of FIG. 7, an intensity peak of a (400) plane of the silicon film and an intensity peak of a (200) plane of the ion film are observed, whereby the iron film is seen to be (100)-oriented. When the orientation of the (200) plane of the ion film was evaluated by a rocking curve measurement method, Δω (representing the dispersion in orientation) was 4.6°. It is seen from the foregoing that a (100) plane of the iron film is mounted on a (100) plane of the silicon film.

Part (a) of FIG. 7 is a graph illustrating XRD measurement results in the in-plane (in-plane measurement) method. The in-plane method is a technique for evaluating a lattice plane perpendicular to a sample surface. As illustrated in part (a) of FIG. 7, the silicon film has four intensity peaks, while the iron film has eight intensity peaks. Here, the intensity peak attributable to a (0-2-2) plane of the silicon film and the intensity peak attributable to a (0-1-1) plane of the iron film are observed at substantially the same relative angle within the sample surface. The intensity peak attributable to a (0-2 2) plane of the silicon film and the intensity peak attributable to a (0-1 1) plane of the iron film are observed at substantially the same relative angle within the sample surface. The intensity peak attributable to a (0 2 2) plane of the silicon film and the intensity peak attributable to a (0 1 1) plane of the iron film are observed at substantially the same relative angle within the sample surface. The intensity peak attributable to a (0 2-2) plane of the silicon film and the intensity peak attributable to a (0 1-1) plane of the iron film are observed at substantially the same relative angle within the sample surface. These results indicate that the silicon film and iron film have in-plane crystal orientations partly coinciding with each other when the Bragg angle of the (0 2 2) plane of the silicon film and the Bragg angle of the (0 1 1) plane of the iron film are taken into consideration. It is also seen that the number of crystal orientations coinciding with the crystal lattices and the number of crystal orientations rotated by 45° from the former crystal orientations are on a par with each other.

When the iron film is epitaxially grown on the magnesium oxide film here, the in-plane crystal orientations of the magnesium oxide film and iron film rotate by 45°. Since the silicon film and iron film have their crystal orientations coinciding with each other in this example, the crystal orientations of the silicon film and magnesium oxide film are presumed to have rotated by 45° in the multilayer structure constituted by the silicon film, magnesium oxide film, and iron film.

The value of intensity indicated in part (b) of FIG. 7 is on the order of hundreds (arb. unit). This value is smaller by several digits than the intensity value (e.g., in the order of tens of thousands to hundreds of thousands (arb. unit)) in the case where all of the silicon film, magnesium oxide film, and iron film are epitaxially grown. In addition, the iron film includes four intensity peaks at locations shifted by 45° from the parts where the intensity peaks of the iron film overlap those of the silicon film. These four intensity peaks do not overlap those of the silicon film. Therefore, it is seen that there are parts where the crystal orientation of the silicon film does not coincide with that of the iron film. This seems to be because the magnesium oxide includes lattice-unmatched parts such as amorphous parts. It is seen from the foregoing measurement results that the magnesium oxide film has a mixture of parts (first lattice-matched parts) lattice-matched with both of the silicon film and iron film and parts (first lattice-unmatched parts) not lattice-matched with both of the silicon film and iron film.

Results of NL Measurement

In the spin transport element made by Example 1, the NL measurement method pinned the direction of magnetization G1 of the first ferromagnetic layer 14A of the first ferromagnetic layer 14A and the direction of magnetization G2 of the second ferromagnetic layer 14B to the same direction (Y direction illustrated in FIG. 3) as with the direction of magnetization of the external magnetic field B1. The external magnetic field B1 was applied to the spin transport element in a direction (Y direction) parallel to the direction of magnetization of the first and second ferromagnetic layers 14A, 14B. A detection current was caused to flow from the AC current source 70 to the first ferromagnetic layer 14A, so as to inject spins from the first ferromagnetic layer 14A into the silicon channel layer 12. Then, an output based on the change in magnetization by the external magnetic field B1 was measured by the output meter 80. Here, the measurement was performed at each of temperatures of 8 K and 300 K.

Figure 8:
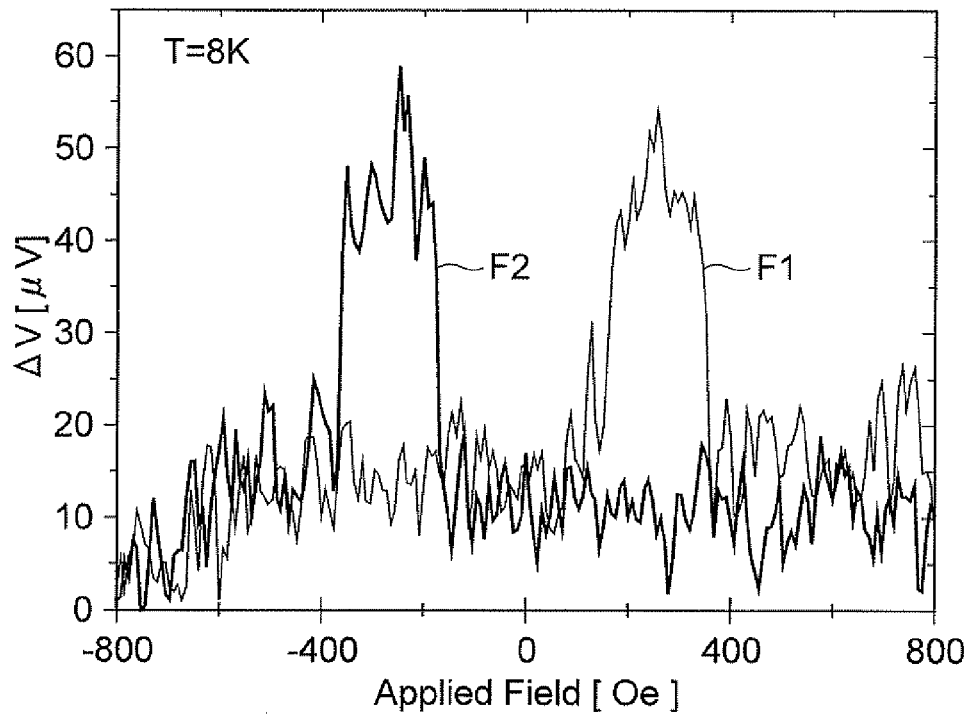
FIG. 8(a) and FIG. 8(b) are graphs illustrating relationships between applied magnetic field and voltage output in an NL measurement method.
Figure 8:
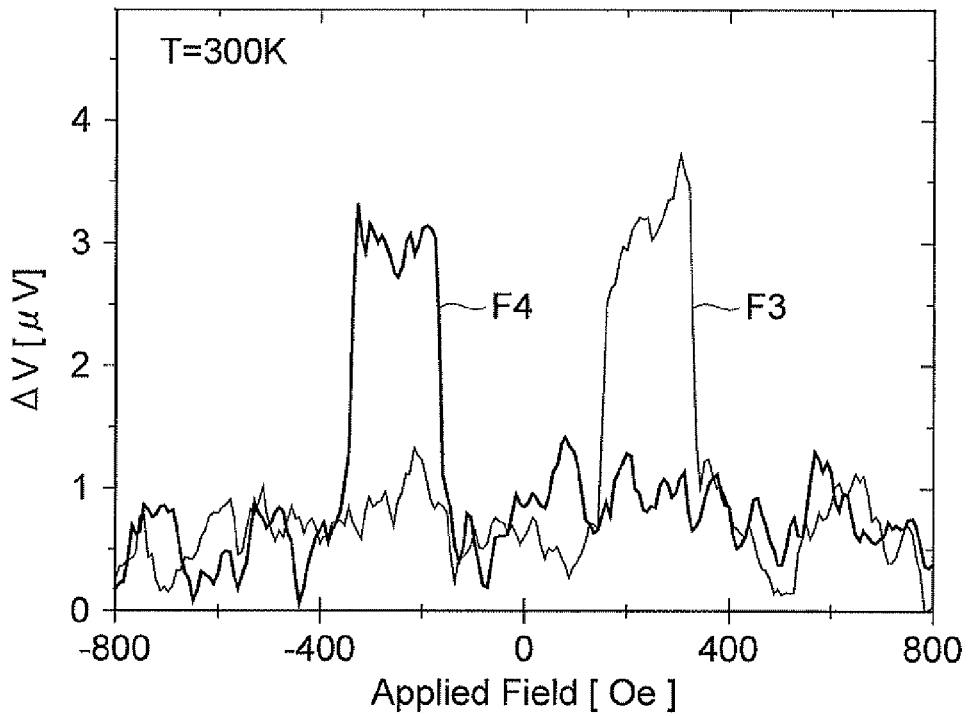

FIG. 8 is a graph illustrating relationships between applied magnetic field and voltage output in the NL measurement method. Parts (a) and (b) of FIG. 8 illustrate the measurement results at temperatures of 8 K and 300 K, respectively. In FIG. 8, F1 in part (a) and F3 in part (b) represent the cases where the external magnetic field B1 was changed from the negative side to the positive side, while F2 in part (a) and F4 in part (b) represent the cases where the external magnetic field B1 was changed from the positive side to the negative side.

As represented by F1 and F2 in part (a) of FIG. 8, the spin transport element exhibited a voltage output of about 50 to 60 μV at the temperature of 8 K. By contrast, as represented by F3 and F4 in part (b) of FIG. 8, the spin transport element exhibited a voltage output of about 3 to 4 μV at the temperature of 300 K. As a result of evaluating the temperature dependence as in the foregoing, the output caused by spins, though decreasing, was observed even at room temperature.

Results of NL-Hanle Measurement

Figure 9:
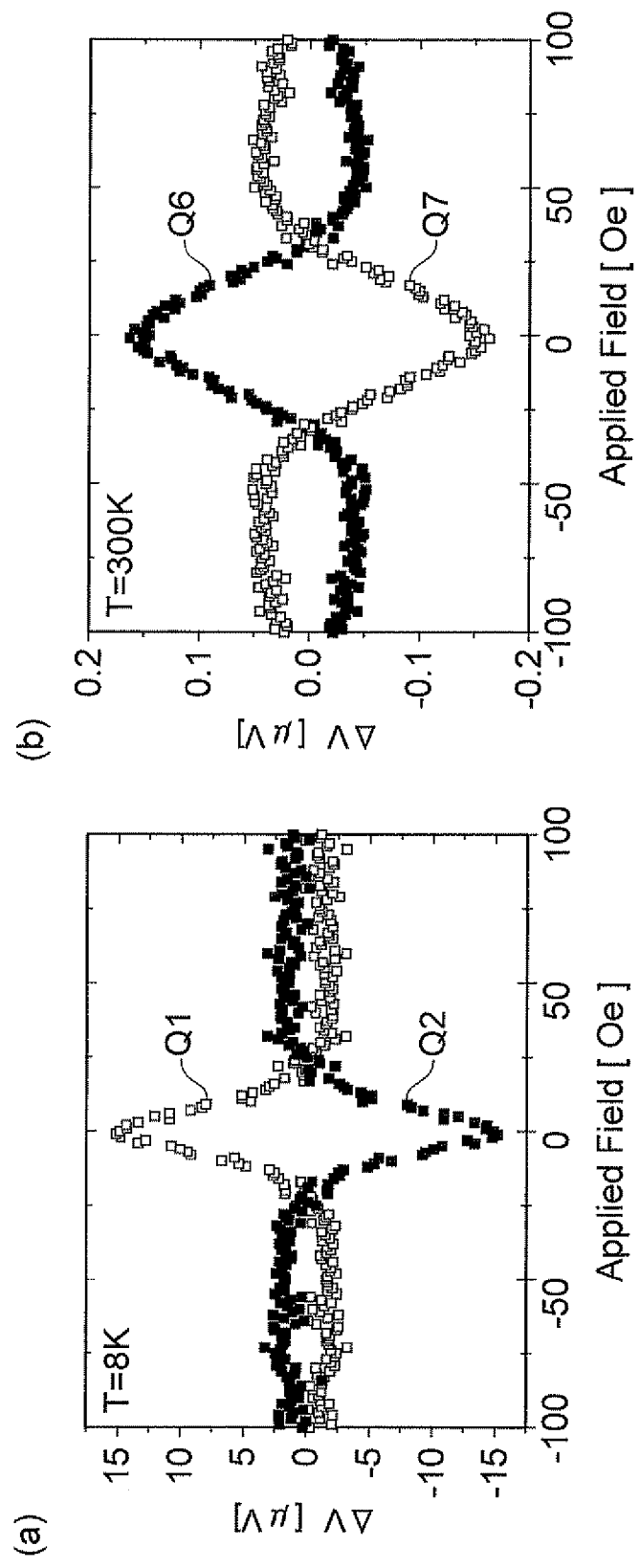
FIG. 9(a) and FIG. 9(b) are graphs illustrating relationships between applied magnetic field and voltage output in an NL-Hanle measurement method.

In the NL-Hanle measurement method, in the spin transport element made by Example 1, the direction (Z direction illustrated in FIG. 3) of the external magnetic field B2 to be applied was made perpendicular to the direction of magnetization G1 (Y direction illustrated in FIG. 3) of the first ferromagnetic layer 14A and the direction of magnetization G2 (Y direction illustrated in FIG. 3) of the second ferromagnetic layer 14B. FIG. 9 is a graph illustrating relationships between applied magnetic field and voltage output in the NL-Hanle measurement method. Q1 in part (a) of FIG. 9 represents the measurement results at the temperature of 8 K in the case where the direction of magnetization of the first ferromagnetic layer 14A was pinned parallel to the direction of magnetization of the second ferromagnetic layer 14B. Q2 in part (a) of FIG. 9 represents the measurement results at the temperature of 8 K in the case where the direction of magnetization of the first ferromagnetic layer 14A was pinned antiparallel to the direction of magnetization of the second ferromagnetic layer 14B. Q6 in part (b) of FIG. 9 represents the measurement results at the temperature of 300 K in the case where the direction of magnetization of the first ferromagnetic layer 14A was pinned parallel to the direction of magnetization of the second ferromagnetic layer 14B. Q7 in part (b) of FIG. 9 represents the measurement results at the temperature of 300 K in the case where the direction of magnetization of the first ferromagnetic layer 14A was pinned antiparallel to the direction of magnetization of the second ferromagnetic layer 14B.

As can be seen from the measurement results of Q1 and Q6 in parts (a) and (b) of FIG. 9, the spins transported through the silicon channel layer are rotated/attenuated by application of the external magnetic field B2. As can be seen from the measurement results of Q6 and Q7 in part (b) of FIG. 9, the waveform is inverted when the combination of the direction of magnetization of the first ferromagnetic layer 14A and the direction of magnetization of the second ferromagnetic layer 14B is changed. The waveform inversion is important information for proving the spin transport in the silicon channel layer.

As a result of evaluating the temperature dependence as in the foregoing, the Hanle effect was observed even at room temperature, though the output somewhat decreased.

Evaluation of Volume Ratio and Spin Polarization

First, a TEM image of a cross section similar to part (b) of FIG. 4 was observed, so as to determine the ratio of the area of a part lattice-matched with both of the silicon film and iron film in the magnesium oxide film to the total area of the magnesium oxide film. Further, supposing the structure of the cross section to be continuous in a direction perpendicular to the cross section, the area ratio was replaced by a volume ratio T. That is, the volume ratio T is the ratio of volume of the part lattice-matched with both of the silicon film and iron film in the magnesium oxide film to the total volume of the magnesium oxide film. Here, a plurality of spin transport elements were made, and the volume ratio T was estimated in each of them. Table 1 represents the relationship between the volume ratio T and spin polarization ratio Ps.

TABLE 1

| Volume ratio % | Spin polarization ratio % |
|---|---|
| 0 | 2.34658 |
| 1.24 | 2.56482 |
| 3.32 | 2.52739 |
| 3.51 | 4.25373 |
| 5 | 6.7364 |
| 8.9 | 12.8626 |
| 9.7 | 12.3474 |
| 11 | 13.152 |
| 13.7 | 11.8267 |
| 15.3 | 12.1316 |
| 23.2 | 10.26383 |
| 33.3 | 9.8263 |
| 49.9 | 6.1732 |
| 50.3 | 3.8762 |
| 54.7 | 3.2537 |

Here, the spin polarization ratio Ps is an efficiency of injecting spins into the silicon film acting as the silicon channel layer 12 or detecting the spins. The spin polarization ratio Ps is represented by the following expression (1) and indicates the spin polarization of the current immediately after being injected into or detected from the silicon channel layer 12. In expression (1), $I_\uparrow$ and $I_\downarrow$ indicate up and down spin state densities, respectively. In Table 1, the spin polarization ratio Ps is multiplied by 100, so as to be expressed in terms of %.

$$P_S = \frac{I_\uparrow - I_\downarrow}{I_\uparrow + I_\downarrow}. \quad (1)$$

The spin polarization ratio Ps can be determined by a numerical analysis. Specifically, as illustrated in part (b) of FIG. 9, NL-Hanle measurement was performed in each of the respective states where the first and second ferromagnetic layers 14A, 14B were parallel and antiparallel to each other, so as to determine a voltage output ΔV. Since the measurement data in the parallel and antiparallel states were opposite in sign in principle, the average of the measurement data in the parallel and antiparallel states was subtracted therefrom as a background. The spin precession motion in the Hanle effect is represented by the following expression (2):

$$\frac{\Delta V(B \perp)}{I} = \pm \frac{Ps^2}{e^2 N(E_F) A} \int_0^\infty \varphi(t) \cos(\omega t) \exp\left(-\frac{t}{\tau}\right) dt, \quad (2)$$

$$\varphi(t) = \sqrt{\frac{1}{4\pi Dt}} \exp\left(-\frac{d^2}{4Dt}\right).$$

Further, the following expression (3) determined by an analytical calculation of expression (2) was used for fitting.

$$\frac{\Delta V(B)}{I} = \pm \frac{Ps^2 \lambda_N}{2\sigma S} \exp\left(-\frac{d}{\lambda_N}\right)(1 + \omega^2 \tau^2)^{-1/4} \times \quad (3)$$

-continued $$\exp\left(-\frac{d}{\lambda_N}\left\{\sqrt{\frac{1}{2}\left(\sqrt{1+\omega^2\tau^2}+1\right)}-1\right\}\right) \times$$

$$\cos\left\{\frac{\tan^{-1}(\omega\tau)}{2}+\frac{d}{\lambda_N}\sqrt{\frac{1}{2}\left(\sqrt{1+\omega^2\tau^2}-1\right)}\right\}.$$

In expressions (2) and (3), I is the current, Ps the spin polarization ratio, e the elementary charge, $N(E_F)$ the state density of the semiconductor at the Fermi level, S the cross-sectional area of the silicon film as the silicon channel layer 12, φ(t) the diffusion density of electrons at the time t, t the diffusion time, τ the spin life time, and D the spin diffusion coefficient. By d is meant the distance (interelectrode distance) between the center part of the length along the X axis of the first ferromagnetic layer 14A and the center part of the length along the X direction of the second ferromagnetic layer 14B. By ω is meant Larmor frequency, and $\omega = g\mu_B B$, where g is the g-factor of an electron, $\mu_B$ the magnetic permeability, and B the external magnetic field. Further, σ is the electrical conductivity of the silicon film, and $\lambda_N$ is the spin diffusion length. Using these parameters, the spin polarization ratio Ps was determined. Since the spin polarization at the time of injecting the current into the silicon channel layer 12 and the spin polarization at the time of detecting spins from the silicon channel layer 12 could not be separated from each other, however, the square root of the square of these values was taken as the spin polarization ratio Ps.

Figure 10:
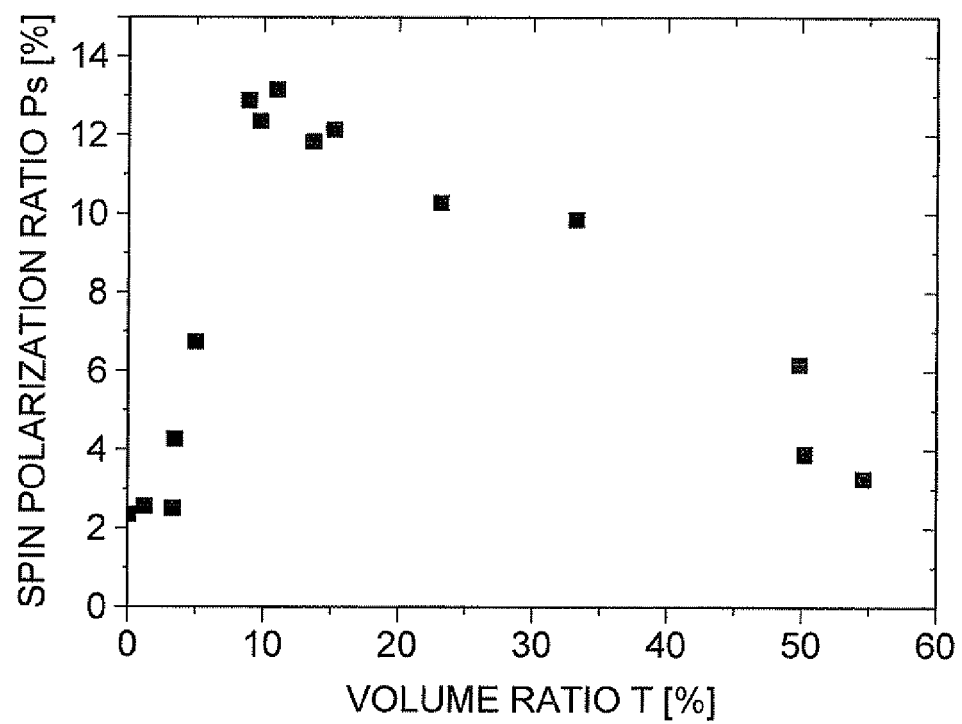
FIG. 10 is a graph illustrating the relationship between volume ratio and spin polarization.

FIG. 10 represents the results of Table 1 as a graph. The spin polarization ratio Ps is seen to depend on the volume ratio T. The output was the highest when the volume ratio was 8.9% with the spin polarization ratio Ps of 12%. Its half value, 6%, was satisfied when the volume ratio T was 5% to 49.9% (nearly 50%), whereby the spin polarization ratio was relatively high. This seems to be because the current and spins were narrowed into the lattice-matched part, so that polarization occurred with a high degree of efficiency. A more preferred range of the volume ratio T was 8.9% to 33.3%, where the spin polarization ratio Ps was particularly high, whereby high output was observed.

What is claimed is:
1. A spin injection electrode structure comprising:
   a silicon channel layer;
   a first magnesium oxide film disposed on a first part of the silicon channel layer; and
   a first ferromagnetic layer disposed on the first magnesium oxide film;
   wherein the first magnesium oxide film partly includes a first lattice-matched part lattice-matched with both of the silicon channel layer and the first ferromagnetic layer.
2. A spin injection electrode structure according to claim 1, wherein the first lattice-matched part in the first magnesium oxide film has a volume ratio of 5 to 50% with respect to the total volume of the first magnesium oxide film.
3. A spin injection electrode structure according to claim 1, wherein the first magnesium oxide film has a thickness of at least 0.6 nm but not exceeding 1.6 nm.
4. A spin injection electrode structure according to claim 1, wherein an interface between the first lattice-matched part and the silicon channel layer has an area not greater than that of an interface between the first lattice-matched part and the first ferromagnetic layer.

5. A spin injection electrode structure according to claim 1, wherein the first ferromagnetic layer has a crystal in a body-centered cubic lattice structure.

6. A spin injection electrode structure according to claim 1, wherein the first ferromagnetic layer is made of a metal selected from the group consisting of Co and Fe, an alloy containing at least one element of the group, or a compound containing at least one element selected from the group and B.

7. A spin injection electrode structure according to claim 1, further comprising an antiferromagnetic layer formed on the first ferromagnetic layer;
   wherein the antiferromagnetic layer pins a direction of magnetization of the first ferromagnetic layer.

8. A spin transport element comprising:
   the spin injection electrode structure according to claim 1;
   a second magnesium oxide film disposed on a second part of the silicon channel layer; and
   a second ferromagnetic layer disposed on the second magnesium oxide film;
   wherein the second magnesium oxide film partly includes a second lattice-matched part lattice-matched with both of the silicon channel layer and the second ferromagnetic layer.

9. A spin transport element according to claim 8, wherein the second ferromagnetic layer has a coercive force greater than that of the first ferromagnetic layer.

10. A spin transport element according to claim 8, wherein the silicon channel layer has a depression between the first and second parts; and
    wherein the depression has a depth of at least 10 nm.

11. A spin transport device having the spin injection electrode structure according to claim 1.

* * * * *